(12) United States Patent
Kim et al.

(10) Patent No.: US 8,611,155 B2
(45) Date of Patent: Dec. 17, 2013

(54) SEMICONDUCTOR MEMORY DEVICE AND PROGRAM METHODS THEREOF

(75) Inventors: Byung Ryul Kim, Seoul (KR); Duck Ju Kim, Gyeonggi-do (KR); You Sung Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 56 days.

(21) Appl. No.: 13/341,382

(22) Filed: Dec. 30, 2011

(65) Prior Publication Data

US 2012/0170373 A1    Jul. 5, 2012

(30) Foreign Application Priority Data

Dec. 30, 2010 (KR) .......................... 10-2010-0139183

(51) Int. Cl.
*G11C 11/34* (2006.01)

(52) U.S. Cl.
USPC .................................................... 365/185.19

(58) Field of Classification Search
USPC .................................................... 365/185.19
See application file for complete search history.

(56) References Cited

U.S. PATENT DOCUMENTS

| | | | | |
|---|---|---|---|---|
| 7,073,103 B2 * | 7/2006 | Gongwer et al. | ............. | 714/718 |
| 8,036,042 B2 * | 10/2011 | Kim et al. | ................ | 365/185.22 |
| 8,174,896 B2 * | 5/2012 | Lim et al. | ................ | 365/185.19 |
| 8,289,769 B2 * | 10/2012 | Lim | .................... | 365/185.03 |
| 8,446,775 B2 * | 5/2013 | Kim et al. | ................ | 365/185.19 |
| 8,446,776 B2 * | 5/2013 | Hwang et al. | ............ | 365/185.19 |
| 2005/0248991 A1 * | 11/2005 | Lee et al. | ................ | 365/185.28 |
| 2009/0040836 A1 * | 2/2009 | Lee | ........................ | 365/185.22 |
| 2009/0285020 A1 * | 11/2009 | Park et al. | ................ | 365/185.03 |
| 2010/0329021 A1 * | 12/2010 | Lee | ........................ | 365/185.19 |
| 2010/0329032 A1 * | 12/2010 | Lim | ....................... | 365/185.22 |
| 2011/0080791 A1 * | 4/2011 | Kim et al. | ................ | 365/185.22 |
| 2011/0103151 A1 * | 5/2011 | Kim et al. | ................ | 365/185.19 |
| 2011/0157998 A1 * | 6/2011 | Yang | ....................... | 365/185.22 |
| 2011/0194353 A1 * | 8/2011 | Hwang et al. | ............ | 365/185.19 |
| 2012/0099375 A1 * | 4/2012 | Choi | ....................... | 365/185.11 |
| 2012/0127791 A1 * | 5/2012 | Lee | ........................ | 365/185.03 |
| 2012/0170366 A1 * | 7/2012 | Kim et al. | ................ | 365/185.03 |
| 2012/0218818 A1 * | 8/2012 | Han et al. | ................ | 365/185.03 |

FOREIGN PATENT DOCUMENTS

KR    1020110001590 A    1/2011

* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

Programming a semiconductor memory device includes: performing a program loop using a blind program operation until the selected cell threshold voltages reach a first verification level; upon detecting a cell having the threshold voltage reaching the first verification level, verifying whether a cell having the threshold voltage reached a second verification level higher than the first verification level; upon verifying a cell having the threshold voltage reaching the second verification level, continuously performing program loops on cells having the first verification level as a target level and on cells having the second verification level as a target level; and upon verifying no cell having the threshold voltage reaching the second verification level, performing a program loop on memory cells having a target level higher than the first verification level, after programming the memory cells having the first verification level as the target level.

19 Claims, 8 Drawing Sheets

SEMICONDUCTOR MEMORY DEVICE AND PROGRAM METHODS THEREOF

CROSS-REFERENCE TO RELATED APPLICATION

Priority is claimed to Korean patent application number 10-2010-0139183 filed on Dec. 30, 2010, the entire disclosure of which is incorporated herein by reference in its entirety.

BACKGROUND

Exemplary embodiments relate generally to program methods of a semiconductor memory device and, more particularly, to program methods which are capable of reducing both the program operation time and the width of a threshold voltage distribution of memory cells.

An incremental step pulse program (hereinafter referred to as an 'ISPP') method of gradually raising the level of a program pulse is recently being chiefly used as a method of programming memory cells. In the ISPP method, the threshold voltages of memory cells can be gradually raised by a gradually raising program pulse applied to the memory cells, thereby suppressing an increase in the width of a threshold voltage distribution.

The ISPP method includes a program operation for applying a program pulse to a word line coupled to selected memory cells to be programmed and a verification operation for verifying whether threshold voltages of the selected memory cells have reached a verification level. If, as a result of the verification operation, the threshold voltages of the selected memory cells have not reached the verification level, the program pulse is raised by a step voltage, and the raised program pulse is applied to the word line in order to raise the threshold voltages of the memory cells. Next, whether the threshold voltages have reached the verification level is verified. The above program and verification process is repeatedly performed while gradually raising the program pulse until the threshold voltages reach the verification level.

In addition, in a multi-level cell (hereinafter referred to as an 'MLC') type in which each memory cell is programmed to various levels, the time that it takes to perform the verification operation becomes long due to various verification levels. For example, in the case where each memory cell is programmed to one of four levels, three verification levels exist. Accordingly, according to a known art, three verification operations using different verification levels are performed until program pulses raised after an initial program pulse is applied to a word line. However, in the case of a memory cell having the highest threshold voltage distribution, i.e., a memory cell to be verified by using the highest verification level, because the threshold voltage of the memory cell is difficult to reach a relevant verification level at the early stage of a program loop, an unnecessary operation time may be consumed if the three verification operations are performed at the memory cell.

BRIEF SUMMARY

According to various exemplary embodiments, the time that it takes to perform a program operation is decreased by omitting a verification operation performed by using a high verification level among various verification levels at the early stage of a program loop of the ISPP method.

Furthermore, an increase of a threshold voltage distribution of memory cells can be suppressed by performing a verification operation at a verification level higher than a specific verification level while performing a verification operation at the specific verification level and by performing a verification operation based on the number of verification levels adjusted according to a verification result.

A program method of a semiconductor memory device according to an aspect of the present disclosure includes performing a program loop using a blind program operation so that the threshold voltages of selected memory cells reach a first verification level, if at least one cell having the threshold voltage reached the first verification level is detected during the program loop, verifying whether there is a cell having the threshold voltage reached a second verification level higher than the first verification level, if, as a result of the verification, there is a cell having the threshold voltage reached the second verification level, continuously performing program loops on memory cells having the first verification level as a target level and on memory cells having the second verification level as a target level, and if, as a result of the verification, there is no cell having the threshold voltage reached the second verification level, performing a program loop on memory cells having a target level higher than the first verification level, after programming the memory cells having the first verification level as the target level.

A semiconductor memory device according to an aspect of the present disclosure comprises a memory cell array including a plurality of memory cells, a circuit group configured to perform a program loop for the memory cells, a control circuit configured to control the circuit group for performing the program loop using a blind program operation so that threshold voltages of selected memory cells reach a first verification level, if at least one cell having the threshold voltage reached the first verification level is detected during the program loop, verifying whether there is a cell having the threshold voltage reached a second verification level higher than the first verification level, if, as a result of the verification, there is a cell having the threshold voltage reached the second verification level, continuously performing a program loop on memory cells having the first verification level as a target level and a program loop on memory cells having the second verification level as a target level, and if, as a result of the verification, there is no cell having the threshold voltage reached the second verification level, performing a program loop on memory cells having a target level higher than the first verification level, after programming the memory cells having the first verification level as the target level.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
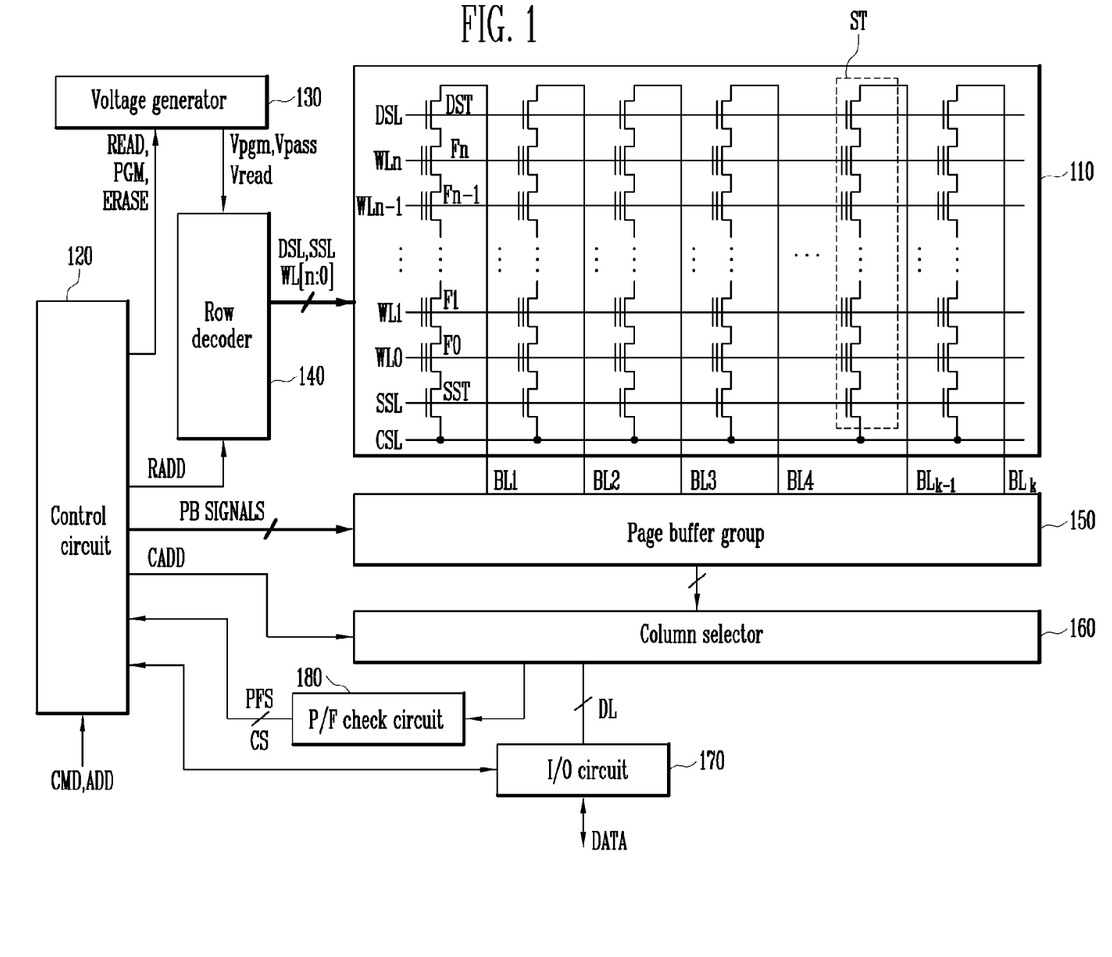
FIG. 1 is a block diagram of a semiconductor memory device for performing the program operations according to an embodiment the present invention.

FIG. 1 is a block diagram of a semiconductor memory device for performing the program operations according to an embodiment the present invention.

Referring to FIG. 1, the semiconductor memory device includes a memory cell array 110, a circuit group (e.g., 130, 140, 150, 160, 170, and 180) for performing a program operation or a read operation for the memory cells of the memory cell array 110, and a control circuit 120 for controlling the circuit group (e.g., 130, 140, 150, 160, 170, and 180) in order to set threshold voltage levels of selected memory cells according to inputted data.

The circuit group may include a voltage generator 130, a row decoder 140, a page buffer group 150, a column selector 160, an I/O circuit 170, and a pass/fail (P/F) check circuit 180.

The memory cell array 110 includes a plurality of memory cell blocks. FIG. 1 shows only one of the memory cell blocks. Each memory cell block includes a plurality of strings ST. Some of the strings ST are designated as normal strings, and some thereof are designated as flag strings. Each of the strings ST may have the same configuration For example, each string includes a source select transistor SST coupled to a common source line CSL, a plurality of memory cells F0 to Fn, and a drain select transistor DST coupled to a bit line BL1. The memory cells included in the flag string are referred to as flag cells, but they have the same configuration as normal memory cells. The gate of the source select transistor SST is coupled to a source select line SSL. The gates of the memory cells F0 to Fn are coupled to respective word lines WL0 to WLn. The gate of the drain select transistor DST is coupled to a drain select line DSL. The strings ST are coupled to the respective bit lines BL1 to BLk and coupled in common to the common source line CSL. Furthermore, a group of the memory cells coupled to the same word line is referred to as a page. For example, a group of the memory cells F1 coupled to the first word line WL1 is referred to as a first page. A program operation is performed for each page.

The control circuit 120 internally generates a program operation signal PGM, a read operation signal READ, or an erase operation signal ERASE in response to a command signal CMD and generates page buffer signals PB SIGNALS for controlling page buffers (not shown) included in the page buffer group 150 according to a type of the operation. The control circuit 120 internally generates a row address signal RADD and a column address signal CADD in response to an address signal ADD. Furthermore, the control circuit 120 checks whether the threshold voltages of selected memory cells have reached to a target level in response to a check signal PFS, generated by the P/F check circuit 180, during a program verification operation and determines whether to perform a program operation again according to a result of the check.

The voltage supply circuit (130, 140) supplies operating voltages necessary for a program operation, an erase operation, and a read operation for the memory cells to the drain select line DSL, the word lines WL0 to WLn, and the source select line SSL of a selected memory cell block in response to the signals READ, PGM, ERASE, and RADD of the control circuit 120. The voltage supply circuit includes the voltage generator 130 and the row decoder 140.

The voltage generator 130 outputs the operating voltages for programming, reading, and erasing the memory cells to global lines in response to the operation signals PGM, READ, and ERASE (that is, the internal command signals) of the control circuit 120. If the memory cells are to be programmed, the voltage generator 130 outputs operating voltages (for example, Vpgm, Vpass, and Vread) for the program to the global lines.

The row decoder 140 transfers the operating voltages, generated by the voltage generator 130, to the local lines DSL, WL[n:0], and SSL of a selected memory cell block in response to the row address signals RADD of the control circuit 120.

The page buffer group 150 includes the page buffers coupled to the respective bit lines BL1 to BLk. The page buffer group 150 applies voltages necessary to store data in the memory cells F0 to Fn to the respective bit lines BL1 to BLk in response to the page buffer signals PB SIGNALS of the control circuit 120. More particularly, the page buffer group 150 precharges the bit lines BL1 to BLk during the program operation, the erase operation, or the read operation for the memory cells F0 to Fn or latches data corresponding to threshold voltages of the memory cells F0 to Fn detected according to a change in the voltages of the bit lines BL1 to BLk. That is, the page buffer group 150 applies a program permission voltage (for example, 0 V) or a program inhibition voltage (for example, Vcc) to the bit lines according to data latched in its latches, during a program operation, and detects data stored in the memory cells F0 to Fn by controlling the voltages of the bit lines BL1 to BLk according to data stored in the memory cells F0 to Fn during a read operation.

The column selector 160 selects the page buffers of the page buffer group 150 in response to the column address signal CADD of the control circuit 120. Data latched in page buffers selected by the column selector 160 is outputted.

The I/O circuit 170 transfers external inputted data DATA to the column selector 160 under the control of the control circuit 120 during a program operation so that the data DATA is inputted to the page buffers of the page buffer group 150. When the data DATA is sequentially inputted to the page buffers of the page buffer group 150, the page buffers store the received data DATA in their latches. Furthermore, during a read operation, the I/O circuit 170 externally outputs the data DATA received from the page buffers of the page buffer group 150 via the column selector 160.

The P/F check circuit 180 checks whether an error cell having a threshold voltage lower than a target voltage exists in memory cells on which a program verification operation performed after a program operation has been performed and outputs a result of the check as a check signal PFC. Furthermore, the P/F check circuit 180 counts the number of error cells and outputs a result of the count as the count signal CS.

The control circuit 120 controls the level of a program voltage applied to a selected word line during a program operation for relevant memory cells and controls the voltage generator 130 such that verification voltages applied to the selected word line can be selectively applied during a program verification operation. Here, the control circuit 120 may control the voltage generator 130 in response to the check signal PFS of the P/F check circuit 180.

Some program methods of the semiconductor memory device are described below.

Program data and program inhibition data are applied to each of the page buffers of the page buffer group 150. A program permission voltage 0 V is applied to the bit lines coupled to the respective page buffers to which the program data has been inputted, and a program inhibition voltage Vcc is applied to the bit lines coupled to the respective page buffers to which the program inhibition data has been inputted. In the state in which the source select transistor SST is turned off and the drain select transistor DST is turned on, after a program pass voltage is applied to all the word lines, a program pulse is applied to a selected word line.

After the program pulse is applied, a verification operation for verifying whether threshold voltages of selected memory cells coupled to the word line have reached a verification level is performed. The verification operation is performed in such a way as to precharge relevant bit lines and apply voltage corresponding to the verification level to the selected word line in order to detect a shift in the voltage levels of the precharged bit lines. That is, if, as a result of the verification, a voltage level of the precharged bit line is maintained, it means that the threshold voltage of a relevant memory cell has reached the verification level. Accordingly, the relevant memory cell is considered as a programmed cell. However, if, as a result of the verification, the voltage level of the precharged bit line is lowered, it means that the threshold voltage of the relevant memory cell has not reached the verification level. Accordingly, the relevant selected memory cell is considered as a non-programmed cell.

If the threshold voltages of the selected memory cells have not reached the verification level, the above program loop (or program and verification operations) is repeatedly performed while gradually raising the program pulse until the threshold voltages of the selected memory cells reach the verification level.

In particular, in the case where each memory cell may have a threshold voltage level among various threshold voltage levels as in an MLC, the number of verification levels is proportional to the number of program levels.

Figure 2:
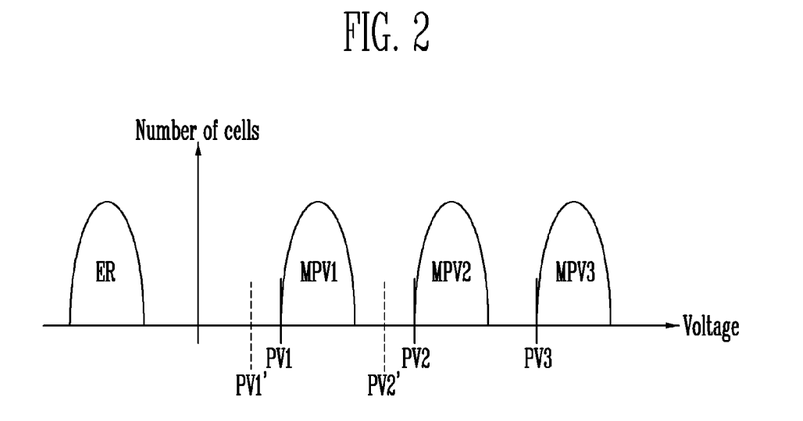
FIG. 2 is a graph illustrating the threshold voltages and verification levels of MLCs.

FIG. 2 is a graph illustrating the threshold voltages and verification levels of MLCs.

An example in which each memory cell may have a threshold voltage level among four different threshold voltage levels is described with reference to FIG. 2. A cell programmed to the lowest level has a first program state MPV1, a memory cell programmed to a level higher than the first program state MPV1 has a second program state MPV2, and a memory cell programmed to a level higher than the second program state MPV2 has a third program state MPV3. The remaining cells having levels other than the first to third program states MPV1 to MPV3 have an erase state ER.

A verification level when a memory cell is programmed to the first program state MPV1 is a first verification level PV1. A verification level when a memory cell is programmed to the second program state MPV2 is a second verification level PV2 which is higher than the first verification level PV1. A verification level when a memory cell is programmed to the third program state MPV3 is a third verification level PV3 which is higher than the second verification level PV2. That is, in order to program a specific memory cell in the first program state MPV1, the specific memory cell has to be programmed by raising the threshold voltage of the selected memory cell so that the threshold voltage reaches the first verification level PV1.

In particular, each of the memory cells included in a specific page may be programmed to one of different program states while a program loop is performed for each page. During the program loop for the specific page, verification operations using the first to third verification levels PV1 to PV3 are performed. Furthermore, in order to narrow the width of a threshold voltage distribution of the memory cells, verification operations using a first temporary level PV1' and a second temporary level PV2', respectively, lower than the verification levels PV1 and PV2 are performed. The program loop is performed by controlling voltage levels of relevant bit lines according to the verification result. The third program state MPV3 is a program state having the highest threshold voltage. Therefore, a third temporary level for narrowing a threshold voltage distribution is not used in order to reduce the time that it takes to perform the program operation.

Various methods of controlling the voltage levels of the bit lines according to the verification result are known, and thus a detailed description thereof is omitted. In an embodiment the present invention, a method of applying a program pulse and a verification method are described in detail.

Figure 3:
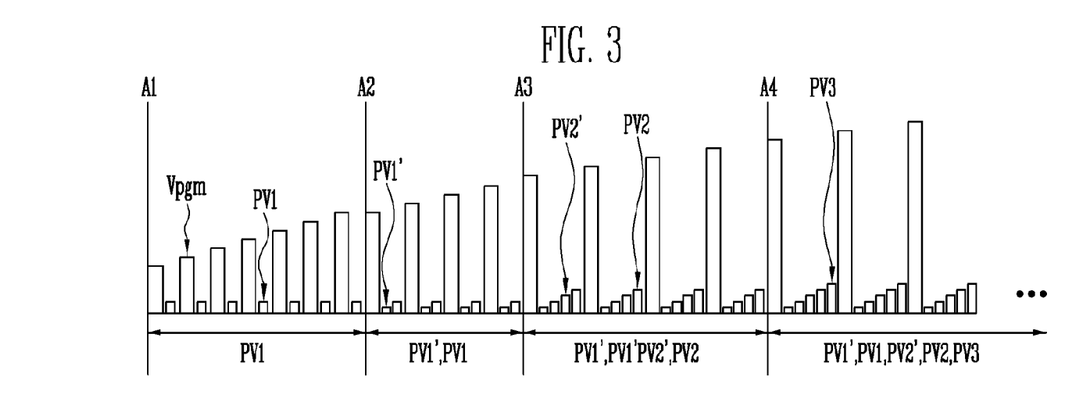
FIGS. 3 to 5 are timing diagrams illustrating a program method according to an exemplary embodiment of the present invention.
Figure 4:
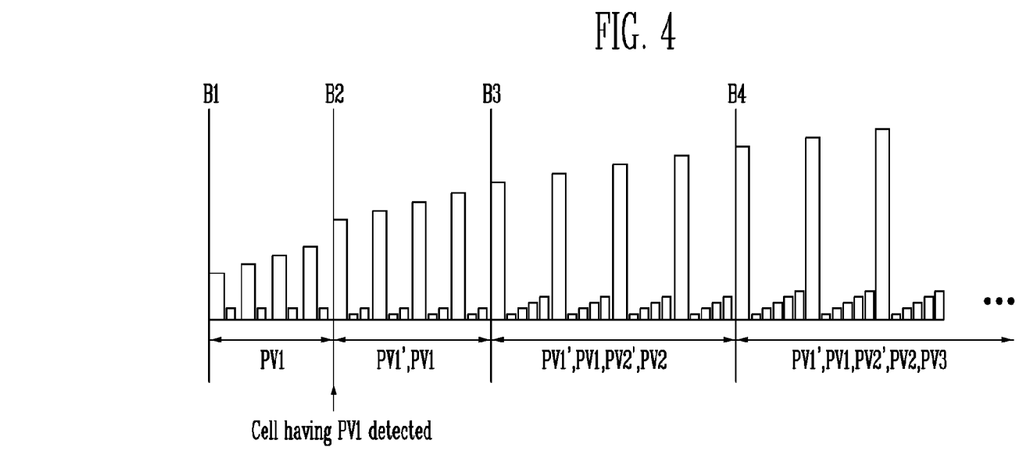
Figure 5:
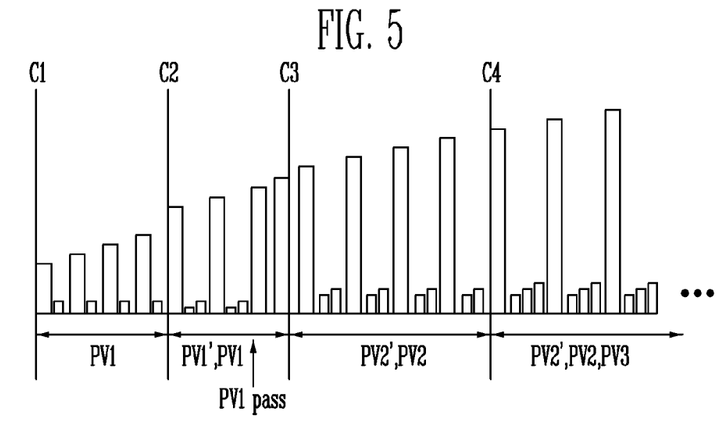

FIGS. 3 to 5 are timing diagrams illustrating a program method according to an exemplary embodiment of the present invention.

Referring to FIGS. 3 and 2, in an initial section A1 to A2 of a program operation, a blind program operation in which a verification operation using a verification voltage of a low level is performed without a verification operation using the verification voltage of a high level is performed because the threshold voltages of memory cells in an erase state are difficult to sharply rise. If the blind program operation is performed, the number of verification operations can be reduced and thus the time that it takes to perform the program operation can be reduced.

More particularly, the number of program pulses Vpgm to be applied so as to perform the blind program operation is set. That is, the number of program pulses in a program loop using only the first verification level PV1 among the various verification levels in a verification operation is set.

For example, if a maximum number of the program pulses are set to 7, after a first program pulse is applied to a selected word line at A1, it is verified whether the threshold voltages of memory cells (that is, memory cells to be programmed) coupled to the word line have reached the first verification level PV1 by applying voltage of the first verification level PV1 to the word line. Here, as described above, verification operations using the second and the third verification levels PV2 and PV3 higher than the first verification level PV1 are omitted. If, as a result of the verification, there is no cell having a threshold voltage reached the first verification level PV1 among the memory cells, the first program pulse is raised by a step level, and the memory cells are then programmed by applying the raised program pulse to the word line. This program operation is called a program operation of the ISPP method. The program loop using the first verification level PV1 as a verification voltage is repeatedly performed until at least one cell having the threshold voltage reached the first verification level PV1 among the memory cells, is detected.

If the number of program pulses applied reaches the maximum number of program pulses in the state in which there is no cell having a threshold voltage reached the first verification level PV1 at A2, in the section after A2, the program loop using the first temporary level PV1' and the first verification level PV1 as verification voltages is performed at A2. More particularly, a program permission voltage 0 V is applied to relevant bit lines coupled to memory cells having the threshold voltages not reached the first temporary level PV1', and a program suppression voltage (e.g., voltage between 0 V and Vcc) is applied to bit lines coupled to cells having the threshold voltages higher than the first temporary level PV1', but lower than the first verification level PV1.

In the section A2 to A3, if a maximum number of program pulses applied are set to 4, verification operations using the first temporary level PV1' and the first verification level PV1 are performed until the program pulse is applied to the word line four times. In the section A2 to A3, if there is no cell having a threshold voltage reached the first temporary level PV1' or the first verification level PV1 during the time for which the four program pulses are applied, a program loop further using the second temporary level PV2' and the second verification level PV2 is started at A3.

In the section A3 to A4, the time that it takes to perform the program operation is reduced by omitting a verification operation using the third verification level PV3. Here, a maximum number of program pulses to be applied are set, and the verification operation using the third verification level PV3 before the number of program pulses reaches the set maximum number is omitted.

For example, in the section A3 to A4, if the maximum number is set to 4, verification operations using the first temporary level PV1', the first verification level PV1, the second temporary level PV2', and the second verification level PV2 as verification voltages are performed until the number of program pulses applied reaches 4. During the time for which the four program pulses are applied in the section A3 to A4, if there is no cell having a threshold voltage reached the first temporary level PV1', the first verification level PV1, the second temporary level PV2', or the second verification level PV2, a program loop using the first temporary level PV1', the first verification level PV1, the second temporary level PV2', the second verification level PV2, and the third verification level PV3 is started at A4.

After A4, a program loop is performed by applying the program permission voltage 0 V, the program inhibition voltage Vcc, or a program suppression voltage, having a level between the program permission voltage 0 V and the program inhibition voltage Vcc, to the bit lines corresponding to memory cells having the threshold voltages reached the first temporary level PV1', the first verification level PV1, the second temporary level PV2', the second verification level PV2, or the third verification level PV3 until the threshold voltages of the selected memory cells reach the first verification level PV1, the second verification level PV2, or the third verification level PV3 (that is, the target levels).

FIG. 4 is a timing diagram illustrating a program method performed when at least one cell having the threshold voltage reached the first verification level PV1 is detected during the program loop of the section A1 to A2 which has been described with reference to FIG. 3.

Referring to FIG. 4, the number of program pulses to be applied to perform the blind program operation is set. The number of program pulses in a program loop using only the first verification level PV1 among the various verification levels in a verification operation is set.

After a first program pulse is applied to a selected word line at B1, it is verified whether the threshold voltages of memory cells (that is, memory cells to be programmed) coupled to the word line have reached the first verification level PV1 by applying voltage of the first verification level PV1 to the word line. If, as a result of the verification, there is no cell having a threshold voltage reached the first verification level PV1, the first program pulse is raised by a step level, and the memory cells are programmed by applying the raised program pulse to the word line. Likewise, a program operation for applying the raised program pulse to the word line and the verification operation using the first verification level PV1 are repeatedly performed until at least one cell having the threshold voltage reached the first verification level PV1 is detected.

If at least one cell having the threshold voltage reached the first verification level PV1 is detected (B2) until the number of gradually rising program pulses reaches the set number of program pulses, a program loop B2 to B3 using the first temporary level PV1' and the first verification level PV1 is performed.

In the section B2 to B3, verification operations using the second and the third verification levels PV2 and PV3 are omitted in order to reduce the time that it takes to perform the program operation. Here, a maximum number of program pulses to be applied is set, and the verification operations using the second and the third verification levels PV2 and PV3 are omitted until the number of program pulses reaches the maximum number.

For example, if the maximum number is set to 4 in the section B2 to B3, verification operations using the first temporary level PV1' and the first verification level PV1 are performed until the number of program pulses to be applied to the selected word line reaches 4. If the result of the verification operation using the first temporary level PV1' is not a "pass" or there is no cell having a threshold voltage reached the first verification level PV1 during the time for which the four program pulses are applied to the word line in the section B2 to B3, a program loop further using the second temporary level PV2' and the second verification level PV2 is started at B3.

In the section B3 to B4, a verification operation using the third verification level PV3 is omitted in order to reduce the time that it takes to perform the program operation. Here, a maximum number of program pulses to be applied are set, and the verification operation using the third verification level PV3 before the number of program pulses reaches the set number of program pulses is omitted.

For example, if the maximum number is set to 4 in the section B3 to B4, the verification operations using the first temporary level PV1', the first verification level PV1, the second temporary level PV2', and the second verification level PV2 are performed only before the fourth program pulse is applied to the word line. If the result of the verification operation using the first temporary level PV1' is not a "pass" or there is no cell having a threshold voltage reached the first verification level PV1, the second temporary level PV2', or the second verification level PV2 even after the program pulse is applied four times in the section B3 to B4, a program loop using the first temporary level PV1', the first verification level PV1, the second temporary level PV2', the second verification level PV2, and the third verification level PV3 is started at B4.

In the section after B4, the program loop is performed until the threshold voltages of the memory cells reach the first verification level PV1, the second verification level PV2, or the third verification level PV3 (that is, target levels) by applying the program permission voltage 0 V, the program inhibition voltage Vcc, or a program suppression voltage, having a level between the program permission voltage 0 V and the program inhibition voltage Vcc, to relevant bit lines corresponding to memory cells having the threshold voltages reached the first temporary level PV1', the first verification level PV1, the second temporary level PV2', the second verification level PV2, or the third verification level PV3.

FIG. 5 is a timing diagram illustrating a program method performed when the result of the verification operation using the first verification level PV1 is a "pass" during the program loop of the section B2 to B3 which has been described with reference to FIG. 4.

Referring to FIG. 5, a maximum number of program pulses for performing a blind program operation is set. The number of program pulses to be applied in the blind program operation using only the first verification level PV1 among the various verification levels is set.

After a first program pulse is applied to a selected word line at C1, it is verified whether the threshold voltages of memory cells (that is, memory cells to be programmed) coupled to the word line have reached the first verification level PV1 by applying voltage of the first verification level PV1 to the word line. If, as a result of the verification, there is no cell having a threshold voltage reached the first verification level PV1 among the memory cells, the first program pulse is raised by a step level, and the memory cells are programmed by applying the raised program pulse to the word line. Likewise, a program operation for applying the raised program pulse to the word line and the verification operation using the first verification level PV1 are repeatedly performed until at least one cell having the threshold voltage reached the first verification level PV1 is detected.

If there is at least one cell having the threshold voltage reached the first verification level PV1 until the number of gradually rising program pulses reaches the set maximum number, a program loop using the first temporary level PV1' and the first verification level PV1 is performed at C2.

In the section C2 to C3, verification operations using the second and the third verification levels PV2 and PV3 are omitted in order to reduce the time that it takes to perform the program operation. Here, a maximum number of program pulses to be applied are set, and the verification operations using the second and the third verification levels PV2 and PV3 before the number of program pulses reaches the set number of program pulses are omitted.

For example, in the section C2 to C3, if the maximum number is set to 4, the verification operations using the first temporary level PV1 and the first verification level PV1 are performed until the number of program pulses applied to the word line reaches 4. If, the result of the verification operation using the first verification level PV1 is a "pass" in the section C2 to C3, the verification operations using the first temporary level PV1 and the first verification level PV1 are no longer performed, but the verification operations (C3) using the second temporary level PV2' and the second verification level PV2 are performed.

In some embodiments, if the threshold voltages of all the selected memory cells reach the first verification level PV1 in the section C2 to C3 and the result of the verification operation using the first verification level PV1 is a "pass", a verification operation using a next verification level may be omitted, and the program pulse may be once applied to the word line. This is because, even though the threshold voltages of all the selected memory cells have reached the first verification level PV1, the threshold voltages of most of the memory cells have not reached the second verification level PV2 higher than the first verification level PV1. For this reason, the program pulse is applied instead of omitting the verification operation once in order to reduce the operation time.

In the section C3 to C4, since the threshold voltages of all the memory cells have reached the first verification level PV1, the verification operations using the first temporary level PV1 and the first verification level PV1 are omitted, and a program loop using the second temporary level PV2' and the second verification level PV2 is performed. Furthermore, in this section, the verification operation using the third verification level PV3 is omitted in order to reduce the time that it takes to perform the program operation. Here, a maximum number of program pulses to be applied is set, and the verification operation using the third verification level PV3 before the number of program pulses reaches the set number of program pulses is omitted.

For example, in the section C3 to C4, if the maximum number is set to 4, the verification operations using the second temporary level PV2' and the second verification level PV2 are performed only before the number of program pulses reaches 4. If there is no cell having a threshold voltage reached the second temporary level PV2' or the second verification level PV2 during the time for which the four program pulses are applied in the section C3 to C4, a program loop using the second temporary level PV2', the second verification level PV2, and the third verification level PV3 is started at C4.

In the section after C4, the program loop is performed until the threshold voltages of the memory cells reach the second verification level PV2 or the third verification level PV3 (that is, a target level) by applying a program permission voltage 0 V, a program inhibition voltage Vcc or a program suppression voltage, having a level between the program permission voltage 0 V and the program inhibition voltage Vcc, to relevant bit lines corresponding to memory cells having the threshold voltages reached the second temporary level PV2', the second verification level PV2 or the third verification level PV3.

Figure 6:
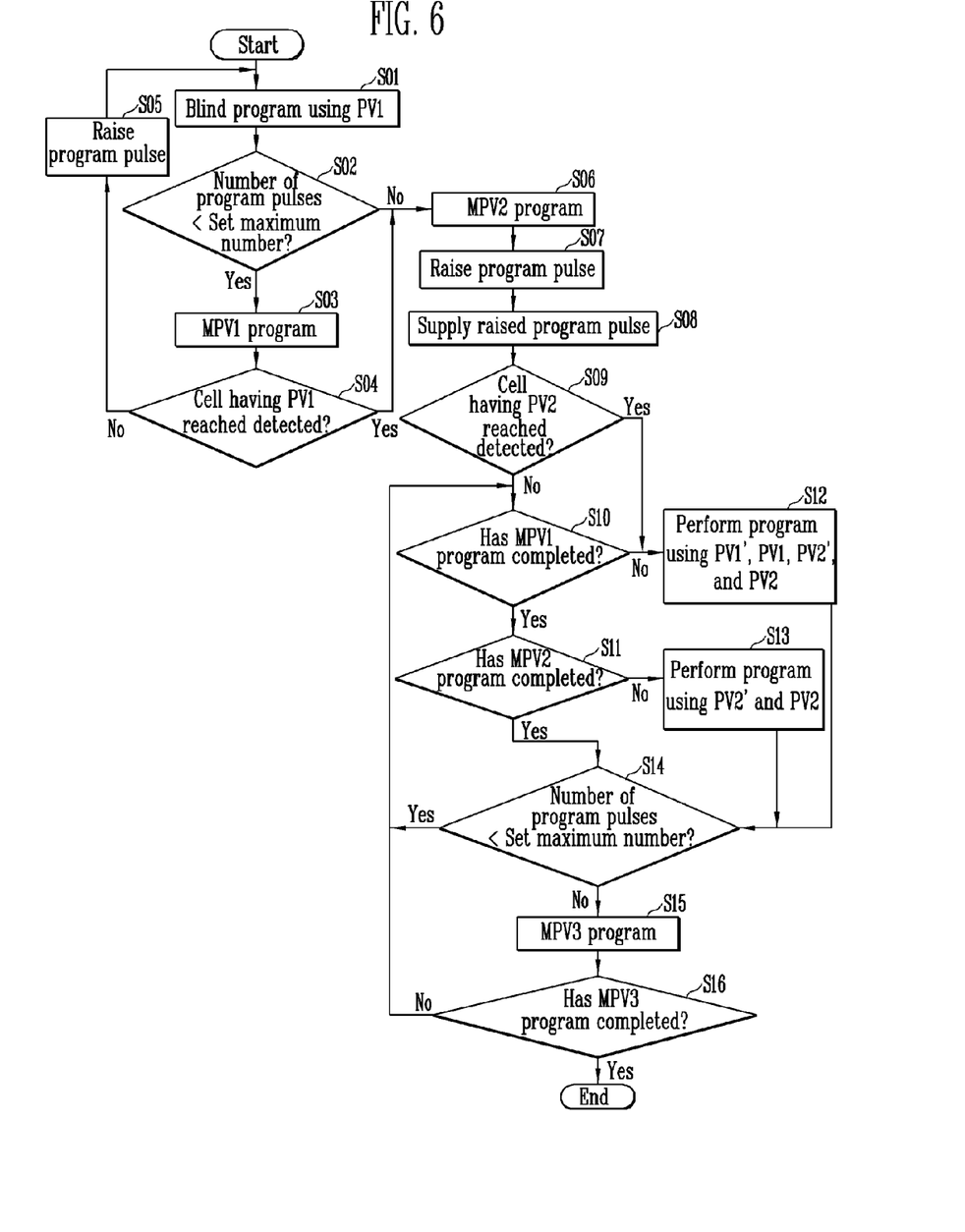
FIG. 6 is a flowchart illustrating a program method according to an exemplary embodiment of the present invention.

FIG. 6 is a flowchart illustrating a program method according to an exemplary embodiment of the present invention.

During the time for which a blind program operation using only the first verification level PV1 is performed, whether there is a memory cell having a threshold voltage reached the second verification level PV2 is verified. In other words, there may be a memory cell having a threshold voltage sharply rise during the blind program operation. In this case, if program and verification operations are started more earlier by detecting the memory cell, the time that it takes to perform the program operation can be reduced.

The program method is described in detail with reference to FIG. 6.

At step S01, the blind program operation using the first verification level PV1 is performed. The blind program operation has been described in detail, and a detailed description thereof is omitted. It is determined whether the number of program pulses applied to a selected word line is smaller than a set maximum number at step S02. If, as a result of the determination, the number of program pulses is smaller than the set maximum number, the first program state MPV1 is maintained at step S03.

A program loop using the first verification level PV1 is performed. At step S04, it is verified whether there at least one cell, having a threshold voltage reached the first verification level PV1, exists in memory cells coupled to the word line. If, as a result of the verification, no cell having a threshold voltage reached the first verification level PV1 is detected, the program pulse is raised at step S05, and a blind program operation using the raised program pulse and the first verification level PV1 is performed again at step S01. Likewise, the steps S01 to S05 are repeatedly performed until at least one cell having the threshold voltage reached the first verification level PV1 is detected.

If, during the steps S01 to S05, the number of program pulses reaches the set maximum number at step S02 or at least one cell having the threshold voltage reached the first verification level PV1 is detected at step S04, a program loop further using the second temporary level PV2' and the second verification level PV2 is performed at step S06. In order to perform the program loop, the program pulse is raised at step S07. The threshold voltages of the memory cells are raised by applying the raised program pulse to the word line at step S08.

It is then verified whether there is at least one cell having the threshold voltage reached the second verification level PV2 at step S09. If, as a result of the verification, there is no cell having a threshold voltage reached the second verification level PV2, verification operations using the first temporary level PV1 and the first verification level PV1 are performed at step S10. If there is at least one cell having the threshold voltage reached the second verification level PV2 at step S09 or there is at least one cell having the threshold voltage not reached the first verification level PV1 at step S10, a program loop using the first temporary level PV1', the first verification level PV1, the second temporary level PV2', and the second verification level PV2 is performed at step S12. If the threshold voltages of all the memory cells reach the first verification level PV1 at step S10 and the result of the first verification operation is a "pass", it is determined whether the threshold voltages of all the memory cells, having the second verification level PV2 as a target level, have reached the second verification level PV2. If, as a result of the determination, there is a memory cell having the threshold voltage not reached the second verification level PV2, a program loop using the second temporary level PV2' and the second verification level PV2 is performed.

If, as a result of the determination, the threshold voltages of all the memory cells have reached the second verification level PV2 at step S11, the number of program pulses applied is compared with the set maximum number at step S14. Here, the step S14 is performed even after the step S12 or S13 is performed. The steps S10 to S14 are repeatedly performed until the number of program pulses applied reaches the set maximum number. If, as a result of the comparison, the number of program pulses applied reaches the set maximum number, a program loop using the third verification level PV3 is performed on memory cells, having the third verification level PV3 as a target level, at step S15.

More particularly, if the threshold voltages of all the memory cells have not reached the first verification level PV1 at step S10, program and verification operations using the first temporary level PV1', the first verification level PV1, the second temporary level PV2', the second verification level PV2, and the third verification level PV3 are performed at step S15. Furthermore, if the threshold voltages of all the memory cells have not reached the second verification level PV2 at step S11, program and verification operations using the second temporary level PV2', the second verification level PV2, and the third verification level PV3 are performed at step S15. Furthermore, if the threshold voltages of all the memory cells have reached the second verification level PV2, program and verification operations using the third verification level PV3 is performed at step S15.

If the threshold voltages of all the memory cells have reached the third verification level PV3, the entire program process is terminated.

The program method according to the above program sequence is described in detail.

FIGS. 7 to 11 are timing diagrams illustrating a program method according to an exemplary embodiment of the present invention.

Figure 7:
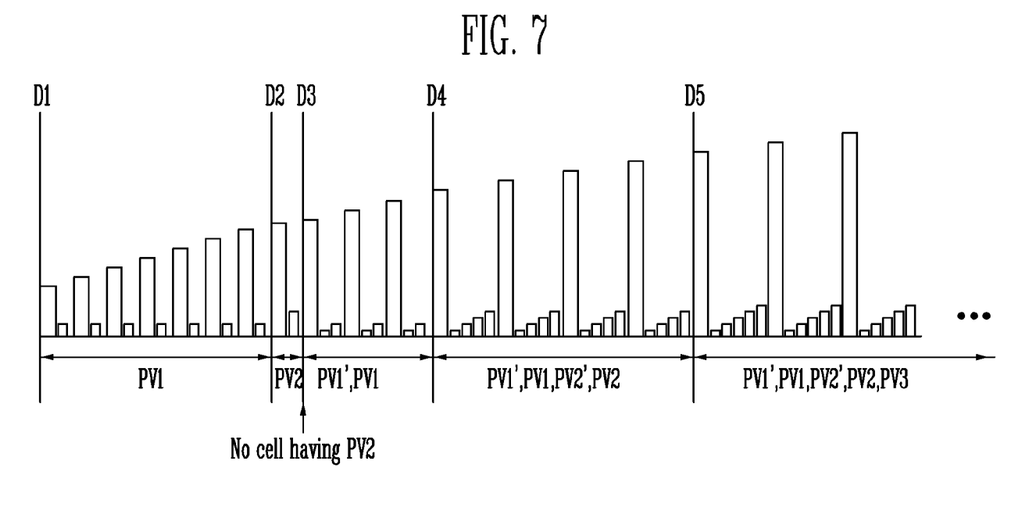
FIGS. 7 to 11 are timing diagrams illustrating a program method according to an exemplary embodiment of the present invention.

Referring to FIGS. 7 and 2, in an initial section D1 to D2 of a program operation, a blind program operation in which a verification operation using a verification voltage of a low level is performed without a verification operation using the verification voltage of a high level is performed because the threshold voltages of memory cells in an erase state are difficult to sharply rise. If the blind program operation is performed, the number of verification operations can be reduced and thus the time that it takes to perform the program operation can be reduced that much.

More particularly, the number of program pulses to be applied to perform the blind program operation is set. That is, the number of program pulses is set in a program loop using only the first verification level PV1 among the various verification levels in a verification operation.

For example, if a maximum number of the program pulses are set to 7, after a first program pulse is applied to a selected word line at D1, it is verified whether the threshold voltages of memory cells (that is, memory cells to be programmed) coupled to the word line have reached the first verification level PV1 by applying voltage of the first verification level PV1 to the word line. Here, as described above, verification operations using the second and the third verification levels PV2 and PV3 higher than the first verification level PV1 are omitted. If, as a result of the verification, there is no cell having a threshold voltage reached the first verification level PV1 among the memory cells, the first program pulse is raised by a step level, and the memory cells are then programmed by applying the raised program pulse to the word line. Likewise, the program operation for applying a gradually rising program pulse to the word line and the verification operation using the first verification level PV1 are repeatedly performed until at least one cell having the threshold voltage reached the first verification level PV1 among the memory cells, is detected.

If the set maximum number is reached without any cell having a threshold voltage reached the first verification level PV1 at D2, the program pulse is applied to the word line once, and a verification operation using the second verification level PV2 is performed in order to determine whether there is a cell having a threshold voltage reached the second verification level PV2 among the memory cells. If, as a result of the verification operation, there is no cell having a threshold voltage reached the second verification level PV2 at D3, a program loop using the first temporary level PV1' and the first verification level PV1 is performed.

In the section D3 to D4, verification operations using the second and the third verification levels PV2 and PV3 are omitted in order to reduce the time that it takes to perform the program operation. Here, a maximum number of program pulses to be applied are set, and the verification operations before the number of program pulses reaches the set maximum number are omitted.

For example, in the section D3 to D4, if the maximum number is set to 3, verification operations using only the first temporary level PV1 and the first verification level PV1 are performed during the program loop in which the program pulse is applied to the word line three times. In the section D3 to D4, if there is no cell having a threshold voltage reached the first temporary level PV1' or the first verification level PV1 during the time for which the three program pulses are applied, a program loop further using the second temporary level PV2' and the second verification level PV2 is started at D4.

In the section D4 to D5, a verification operation using the third verification level PV3 is omitted in order to reduce the time that it takes to perform the program operation. Here, a maximum number of program pulses to be applied is set, and the verification operation before the number of program pulses reaches the set maximum number is omitted.

For example, in the section D4 to D5, if the maximum number is set to 4, verification operations using the first temporary level PV1', the first verification level PV1, the second temporary level PV2', and the second verification level PV2 are performed until the four program pulses are applied to the word line. In the section D4 to D5, if there is no cell having a threshold voltage reached the first temporary level PV1', the first verification level PV1, the second temporary level PV2', or the second verification level PV2 during the time for which the four program pulses are applied, a program loop using the first temporary level PV1', the first verification level PV1, the second temporary level PV2', the second verification level PV2, and the third verification level PV3 is started at D5.

In the section after D5, a program loop is performed until threshold voltages of the memory cells reach the first verification level PV1, the second verification level PV2, or the third verification level PV3 (that is, target levels) by applying a program permission voltage 0 V, a program inhibition voltage Vcc, or a program suppression voltage, having a level between the program permission voltage 0 V and the program inhibition voltage Vcc, to relevant bit lines corresponding to memory cells having the threshold voltages reached the first temporary level PV1', the first verification level PV1, the second temporary level PV2', the second verification level PV2, or the third verification level PV3.

Figure 8:
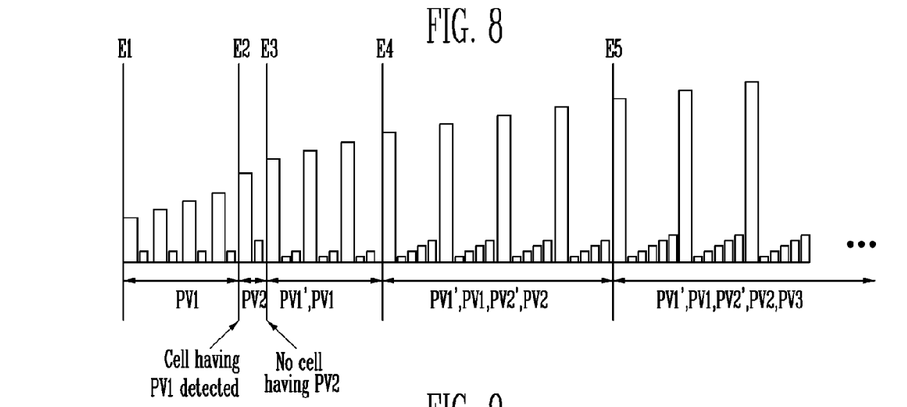

FIG. 8 is a timing diagram illustrating a program method performed when there is at least one cell having the threshold voltage reached the first verification level PV1 during the program loop of the section D1 to D2 which has been described with reference to FIG. 7.

Referring to FIG. 8, the number of program pulses to be applied to perform a blind program operation is set. That is, the number of program pulses is set in a program loop using only the first verification level PV1 among the various verification levels in a verification operation. After a first program pulse is applied to the selected word line at E1, it is verified whether threshold voltages of the memory cells (that is, memory cells to be programmed) coupled to the word line have reached the first verification level PV1 by applying voltage of the first verification level PV1 to the word line. If, as a result of the verification, there is no cell having a threshold voltage reached the first verification level PV1, the first program pulse is raised by a step level, and the memory cells are programmed by applying the raised program pulse to the word line. Likewise, the program operation for applying a gradually rising program pulse to the word line and the verification operation using the first verification level PV1 are repeatedly performed until at least one cell having the threshold voltage reached the first verification level PV1 exits in the memory cells.

If there is at least one cell having the threshold voltage reached the first verification level PV1 before the number of gradually rising program pulses reaches the set maximum number at E2, the program pulse is applied to the word line, and it is then verified whether there is a cell having a threshold voltage reached the second verification level PV2. If, as a result of the verification, there is no cell having the threshold voltage reached the second verification level PV2, a program loop (E3 to E4) using the first temporary level PV1' and the first verification level PV1 is performed.

In the section E3 to E4, verification operations using the second and the third verification levels PV2 and PV3 are omitted in order to reduce the time that it takes to perform the program operation. Here, a maximum number of program pulses to be applied are set, and the verification operations before the number of program pulses reaches the set maximum number are omitted.

For example, in the section E3 to E4, if the maximum number is set to 3, verification operations using the first temporary level PV1 and the first verification level PV1 are performed until the three program pulses are applied to the word line. In the section E3 to E4, if all the threshold voltages of the memory cells have not reached the first verification level PV1 during the time for which the three program pulses are applied to the word line, a program loop further using the second temporary level PV2' and the second verification level PV2 as verification voltages is started at E4.

In the section E4 to E5, a verification operation using the third verification level PV3 is omitted in order to reduce the time that it takes to perform the program operation. Here, a maximum number of program pulses to be applied are set, and the verification operation before the number of program pulses reaches the set maximum number is omitted.

For example, in the section E4 to E5, if the maximum number is set to 4, a program loop using the first temporary level PV1', the first verification level PV1, the second temporary level PV2', and the second verification level PV2 as verification voltages is performed until the number of program pulses reaches 4. In the section E3 to E5, if each of the results of the verification operations using the first verification level PV1 and the second verification level PV2 are not a "pass" even after the number of program pulses reaches 4, a program loop using the first temporary level PV1', the first verification level PV1, the second temporary level PV2', the second verification level PV2, and the third verification level PV3 as verification voltages is started at E5.

In the section after E5, the program loop is performed until the threshold voltages of the memory cells reach the first verification level PV1, the second verification level PV2, or the third verification level PV3 (that is, target levels) by applying a program permission voltage 0 V, a program inhibition voltage Vcc, or a program suppression voltage, having a level between the program permission voltage 0 V and the program inhibition voltage Vcc, to relevant bit lines corresponding to memory cells having the threshold voltages reached the first temporary level PV1', the first verification level PV1, the second temporary level PV2', the second verification level PV2, or the third verification level PV3.

Figure 9:
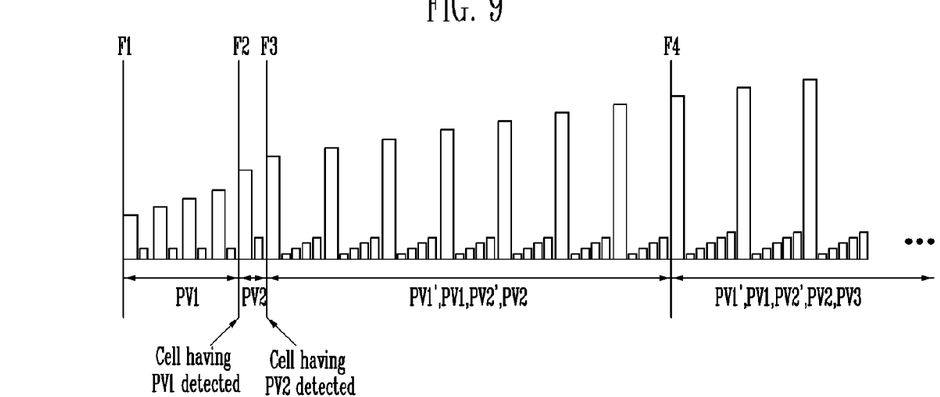

FIG. 9 is a timing diagram illustrating a program method performed when at least one cell having the threshold voltage reached the second verification level PV2 is detected after at least one cell having the threshold voltage reached the first verification level PV1 is detected during the program loop of the section E1 to E3 which has been described with reference to FIG. 8.

Referring to FIG. 9, the number of program pulses to be applied to perform a blind program operation is set. The number of program pulses is set in a program loop using only the first verification level PV1 among the various verification levels in a verification operation. After a first program pulse is applied to the selected word line at F1, it is verified whether threshold voltages of the memory cells (that is, memory cells to be programmed) coupled to the word line have reached the first verification level PV1 by applying voltage of the first verification level PV1 to the word line.

If, as a result of the verification, any cell having the threshold voltage reached the first verification level PV1 does not exist in the memory cells, the first program pulse is raised by a step level, and the memory cells are programmed by applying the raised program pulse to the word line. Likewise, the program operation for applying a gradually rising program pulse to the word line and the verification operation using the first verification level PV1 are repeatedly performed until at least one cell having the threshold voltage reached the first verification level PV1 is detected.

If at least one cell having the threshold voltage reached the first verification level PV1 is detected before the number of gradually rising program pulses reaches the set maximum number at F2, the program pulse is applied to the word line and it is then verified whether there is any cell having the threshold voltage reached the second verification level PV2. If, as a result of the verification, at least one cell having the threshold voltage reached the second verification level PV2 is detected, a program loop further using the second temporary level PV2' and the second verification level PV2 as verification voltages is started at F3.

In the section F3 to F4, a verification operation using the third verification level PV3 is omitted in order to reduce the time that it takes to perform the program operation. Here, a maximum number of program pulses to be applied is set, and the verification operation using the third verification level PV3 before the number of program pulses reaches the set maximum number is omitted.

For example, in the section F3 to F4, if the maximum number is set to 7, the program loop using the first temporary level PV1', the first verification level PV1, the second temporary level PV2', and the second verification level PV2 as verification voltages is performed until the number of program pulses reaches 7. In the section F3 to F4, if each of the results of the verification operations using the first verification level PV1 and the second verification level PV2 are not a "pass" even after the number of program pulses reaches 7, a program loop using the first temporary level PV1', the first verification level PV1, the second temporary level PV2', the second verification level PV2, and the third verification level PV3 as verification voltages is started at F4.

In the section after F4, a program loop is performed until the threshold voltages of the memory cells reach the first verification level PV1, the second verification level PV2, or the third verification level PV3 (that is, target levels) by applying a program permission voltage 0 V, a program inhibition voltage Vcc, or a program suppression voltage, having a level between the program permission voltage 0 V and the program inhibition voltage Vcc, to relevant bit lines corresponding to memory cells having the threshold voltages reached the first temporary level PV1', the first verification level PV1, the second temporary level PV2', the second verification level PV2, or the third verification level PV3.

Figure 10:
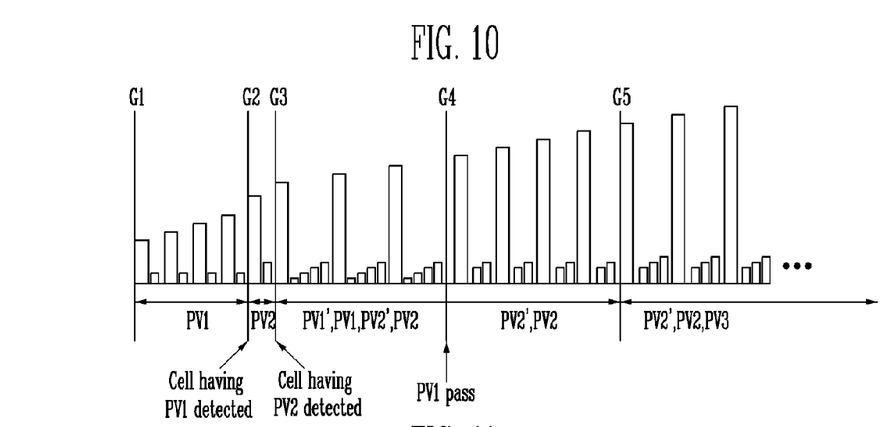

FIG. 10 is a timing diagram illustrating a program method performed when the threshold voltages of all the memory cells have reached the first verification level PV1 during the program loop of the section F3 to F4 which has been described with reference to FIG. 9.

Referring to FIG. 10, the number of program pulses to be applied to perform a blind program operation is set. The number of program pulses is set in a program loop using only the first verification level PV1 among the various verification levels in a verification operation. After a first program pulse is applied to the selected word line at G1, it is verified whether threshold voltages of the memory cells (that is, memory cells to be programmed) coupled to the word line have reached the first verification level PV1 by applying voltage of the first verification level PV1 to the selected word line.

If, as a result of the verification, any cell having the threshold voltage reached the first verification level PV1 does not exist in the memory cells, the first program pulse is raised by a step level and the memory cells are programmed by applying the raised program pulse to the word line. Likewise, the program operation for applying a gradually rising program pulse to the word line and the verification operation using the first verification level PV1 are repeatedly performed until at least one cell having the threshold voltage reached the first verification level PV1 is detected.

If at least one cell having the threshold voltage reached the first verification level PV1 is detected before the number of gradually rising program pulses reaches the set maximum number at G2, the program pulse is applied to the word line and it is then verified whether there is a cell having the threshold voltage reached the second verification level PV2. If, as a result of the verification, at least one cell having the threshold voltage reached the second verification level PV2 is detected at G3, a program loop further using the second temporary level PV2' and the second verification level PV2 as verification voltages is started at G3.

In the section after G3, the program loop using the first temporary level PV1', the first verification level PV1, the second verification level PV2', and the second verification level PV2 as the verification voltages is performed. If the threshold voltages of all the memory cells reach the first verification level PV during the program loop at G4, a program loop using only the second temporary level PV2' and the second verification level PV2 as verification voltages is performed.

In the section after G4, if the threshold voltages of all the memory cells have not reached the second verification level PV2 until the number of program pulses reaches the set maximum number at G5, a program loop further using the third verification level PV3 as a verification voltage is performed in the section after G5. That is, the program loop using the second temporary level PV2', the second verification level PV2, and the third verification level Pv3 as the verification voltages is performed.

In the section after G5, the program loop is performed until the threshold voltages of the memory cells reach the second verification level PV2 or the third verification level PV3 (that is, a target level) by applying a program permission voltage 0 V, a program inhibition voltage Vcc, or a program suppression voltage, having a level between the program permission voltage 0 V and the program inhibition voltage Vcc, to relevant bit lines corresponding to memory cells having the threshold voltages reached the second temporary level PV2', the second verification level PV2, or the third verification level PV3.

Figure 11:
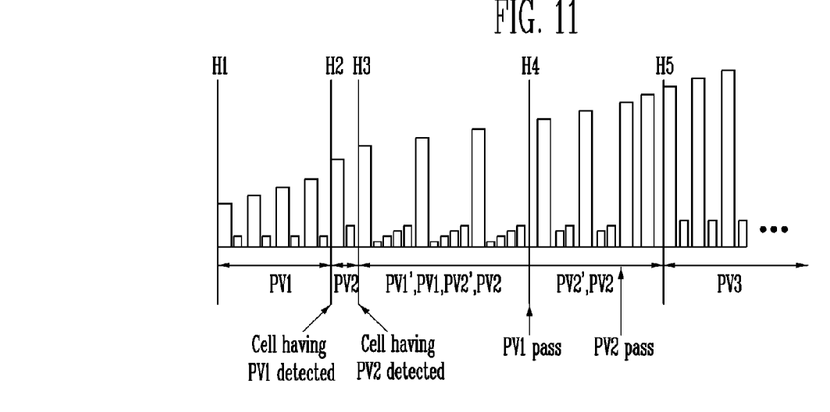

FIG. 11 is a timing diagram illustrating a program method performed when the threshold voltages of all the memory cells have reached the second verification level PV2 in the section G4 to G5 during the program loop of the section G4 to G5 which has been described with reference to FIG. 10.

Referring to FIG. 11, the number of program pulses to be applied to perform a blind program operation is set. The number of program pulses is set in a program loop using only the first verification level PV1 among the various verification levels in a verification operation. After a first program pulse is applied to a selected word line at H1, it is verified whether the threshold voltages of memory cells (that is, memory cells to be programmed) coupled to the word line have reached the first verification level PV1 by applying voltage of the first verification level PV1 to the word line. If, as a result of the verification, there is no cell having the threshold voltage reached the first verification level PV1, the first program pulse is raised by a step level and the memory cells are programmed by applying the raised program pulse to the word line. Likewise, the program operation for applying a gradually rising program pulse to the word line and the verification operation using the first verification level PV1 are repeatedly performed until at least one cell having the threshold voltage reached the first verification level PV1 among the memory cells, is detected.

If at least one cell having the threshold voltage reached the first verification level PV1 is detected before the number of gradually rising program pulses reaches the set maximum number at H2, the program pulse is applied to the word line and it is then verified whether there is a cell having the threshold voltage reached the second verification level PV2. If, as a result of the verification, at least one cell having the threshold voltage reached the second verification level PV2 is detected, a program loop further using the second temporary level PV2' and the second verification level PV2 as verification voltages is started at H3.

In a section after H3, the program loop using the first temporary level PV1', the first verification level PV1, the second verification level PV2', and the second verification level PV2 as the verification voltages is performed. If the threshold voltages of all the memory cells reach the first verification level PV1 during the program loop at H4, a program loop using only the second temporary level PV2' and the second verification level PV2 as verification voltages is performed in a section after H4.

If the threshold voltages of all the memory cells reach the second verification level PV2 in the section after H4 before the number of program pulses reaches the set maximum number, a program loop using only the third verification level PV3 as a verification voltage is performed. In a section after H5, the program loop is performed until the threshold voltages of all the memory cells reach the third verification level PV3.

According to this disclosure, the time that it takes to perform a program operation can be reduced, and an increase in the threshold voltages of memory cells to be programmed can be suppressed. Accordingly, the program operation can be performed for a short time, and also the width of a threshold voltage distribution of memory cells can be reduced.

What is claimed is:

1. A program method of a semiconductor memory device, comprising:
    performing a first program loop, including a program operation and a first verification operation using a voltage having a first verification level, on first selected memory cells and second selected memory cells until at least one of the first selected memory cells passes the first verification operation;
    performing a second program loop, including a program operation and a second verification operation using a voltage having a second verification level higher than the first verification level, on the first selected memory cells and the second selected memory cells, wherein the second verification operation is performed on the second selected memory cells; and
    performing a third program loop on the first selected memory cells or a fourth program loop on the first and second selected memory cells according to a result of the second verification operation, wherein the third program loop includes a program operation and the first verification operation, and the fourth program loop includes a program operation, the first verification operation and the second verification operation.

2. The program method of claim 1, wherein the first second, third and fourth program loops are performed using an incremental step pulse program (ISPP) method.

3. The program method of claim 1, wherein the first program loop is performed using a blind verification operation.

4. The program method of claim 1, wherein the third program loop is performed if all the second selected memory cells do not pass the second verification operation, and the fourth program loop is performed if at least one of the second selected memory cells pass the second verification operation.

5. The program method of claim 4, further comprises performing a first temporary verification operation using a voltage having a first temporary level lower than the first verification level before the first verification operation is performed during the third and the fourth program loops.

6. The program method of claim 4, further comprises performing a second temporary verification operation using a voltage having a second temporary level between the first verification level and the second verification level before the second verification operation is performed during the fourth program loop.

7. The program method of claim 1, further comprises performing a fifth program loop, including a program operation and the second verification operation, until all the second selected memory cells pass the second verification operation, if all the first memory cells pass the first verification operation during the third program loop.

8. The program method of claim 1, further comprises performing a sixth program loop, including a program operation and the second verification operation, until all the second selected memory cells pass the second verification operation, if all the first memory cells pass the first verification operation during the fourth program loop.

9. The program method of claim 1, wherein
    the program operations are performed by applying a program pulse to a word line coupled to the first and second selected memory cells,
    the first verification operation is performed by applying a voltage having the first verification level to the word line to verify the first selected memory cells; and
    the second verification operation is performed by applying a voltage having the second verification level to the word line to verify the second selected memory cells.

10. The program method of claim 9, wherein the first verification operation is performed by applying different voltages to bit lines, corresponding to respective threshold voltages of the first selected memory cells, according to the first verification level and a first temporary level lower than the first verification level.

11. The program method of claim 10, wherein the first verification operation is performed by applying a program permission voltage to bit lines corresponding to memory cells including threshold voltages not having reached the first temporary level among the bit lines, applying a program suppression voltage to bit lines corresponding to memory cells including threshold voltages having reached a level between the first temporary level and the first verification level among the bit lines, and applying a program inhibition voltage to bit lines corresponding to memory cells including threshold voltages having reached the first verification level among the bit lines, until threshold voltages of remaining cells reach the first verification level.

12. The program method of claim 11, wherein:
    the program permission voltage is 0 V, the program inhibition voltage is a power supply voltage, and the program suppression voltage is between the program permission voltage and the power supply voltage.

13. The program method of claim 1, further comprising:
    performing a seventh program loop, including a program operation, the first verification operation, the second verification operation and a third verification operation using a voltage having a third verification level higher than the second verification level, on the first selected memory cells, the second selected memory cells and third selected memory cells until all the first selected memory cells pass the first verification operation, if all the first memory cells do not pass the first verification operation and a number of program pulses of the fourth program loop reaches the maximum number.

14. The program method of claim 13, further comprising:
    performing a first temporary verification operation using a voltage having a first temporary level lower than the first verification level before the first verification operation is performed during the seventh program loops; and
    performing a second temporary verification operation using a voltage having a second temporary level between the first verification level and the second verification level before the second verification operation is performed during the seventh program loop.

15. The program method of claim 13, further comprises performing a eighth program loop, including a program operation, the second verification operation and the third verification operation, on the second selected memory cells and the third selected memory cells until all the second selected memory cells pass the second verification operation, if all the first selected memory cells pass the first verification operation.

16. The program method of claim 15, further comprises performing a second temporary verification operation using a voltage having a second temporary level between the first verification level and the second verification level before the second verification operation is performed during the eighth program loop.

17. The program method of claim 16, further comprises performing a ninth program loop, including a program operation and the third verification operation, on the third selected memory cells until all the third selected memory cells pass the third verification operation, if all the second selected memory cells pass the second verification operation.

18. A semiconductor memory device comprising:
a memory cell array including a plurality of memory cells;
a circuit group configured to perform a program loop on the memory cells; and
a control circuit configured to control the circuit group for performing a first program loop, including a program operation and a first verification operation using a voltage having a first verification level, on first selected memory cells and second selected memory cells until at least one of the first selected memory cells passes the first verification operation, performing a second program loop, including a program operation and a second verification operation using a voltage having a second verification level higher than the first verification level, on the first selected memory cells and the second selected memory cells, wherein the second verification operation is performed on the second selected memory cells, and performing a third program loop on the first selected memory cells or a fourth program loop on the first and second selected memory cells according to a result of the second verification operation, wherein the third program loop includes a program operation and the first verification operation, and the fourth program loop includes a program operation, the first verification operation and the second verification operation.

19. The semiconductor memory device of claim 18, comprising:
a voltage generator configured to output operating voltages for the program loop for the memory cells to global lines;
a row decoder configured to transfer the operating voltages to local lines of a selected memory cell block of the memory cell array;
a page buffer group configured to apply voltages to bit lines;
a column selector configured to select page buffers of the page buffer group an I/O circuit configured to transfer external inputted data DATA to the column selector under the control of the control circuit during the program loop; and
a P/F check circuit configured to check whether an error cell having a threshold voltage lower than a target voltage exists in the memory cells.

* * * * *